(12) United States Patent
Chen (10) Patent No.: US 11,054,483 B2
(45) Date of Patent: Jul. 6, 2021

(54) TERMINAL DEVICE, METHOD FOR LEAKAGE DETECTION THEREFOR

(71) Applicant: Guangdong Oppo Mobile Telecommunications Corp., Ltd., Guangdong (CN)

(72) Inventor: Wei Chen, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 131 days.

(21) Appl. No.: 16/413,120

(22) Filed: May 15, 2019

(65) Prior Publication Data

US 2019/0265307 A1 Aug. 29, 2019

Related U.S. Application Data

(63) Continuation of application No. PCT/CN2018/074938, filed on Feb. 1, 2018.

(51) Int. Cl.
*G01R 31/392* (2019.01)
*G01R 31/3842* (2019.01)
(Continued)

(52) U.S. Cl.
CPC ....... *G01R 31/392* (2019.01); *G01R 31/3842* (2019.01); *H02J 7/008* (2013.01);
(Continued)

(58) Field of Classification Search
CPC .............. G01R 31/382; G01R 31/3828; G01R 31/3835; G01R 31/3842; G01R 31/36; G01R 31/3646; G01R 3/392
See application file for complete search history.

(56) References Cited

U.S. PATENT DOCUMENTS

| 6,288,520 B1 * | 9/2001 | Kim ................... H02J 7/0069 320/112 |
| 6,545,448 B1 * | 4/2003 | Stanley ................ H01M 10/48 320/132 |

(Continued)

FOREIGN PATENT DOCUMENTS

| CN | 101465449 A | 6/2009 |
| CN | 103904699 A | 7/2014 |

(Continued)

OTHER PUBLICATIONS

Extended European search report issued in corresponding European application No. 18882292.8 dated Jan. 9, 2020.

(Continued)

*Primary Examiner* — Adi Amrany (57) ABSTRACT

Provided are a terminal device and a method for leakage detection therefor. The method includes the following. Power consumption of the battery is detected, upon determining that the terminal device is fully charged and remains coupled with the adapter and at least one power-consuming component of the terminal device is in a non-working state, the at least one power-consuming component is powered by the battery when the terminal device is fully charged and remains coupled with the adapter. Whether the terminal device experiences leakage is determined according to power consumption of the battery.

13 Claims, 5 Drawing Sheets

(51) Int. Cl.
*H02J 7/00* (2006.01)
*G01R 31/52* (2020.01)
(52) U.S. Cl.
CPC ............ *H02J 7/0029* (2013.01); *G01R 31/52* (2020.01); *H02J 7/0068* (2013.01); *H02J 7/00306* (2020.01)

(56) References Cited

U.S. PATENT DOCUMENTS

| | | | | |
|---|---|---|---|---|
| 2008/0018306 | A1* | 1/2008 | Shin | G01R 15/04 320/149 |
| 2009/0039835 | A1 | 2/2009 | Wolf et al. | |
| 2010/0324847 | A1 | 12/2010 | Yen | |
| 2011/0057658 | A1* | 3/2011 | Yugou | B60L 7/10 324/426 |
| 2012/0105008 | A1* | 5/2012 | Lipcsei | H02J 7/00718 320/134 |
| 2012/0326502 | A1* | 12/2012 | Nguyen | H02J 7/027 307/21 |
| 2013/0082662 | A1* | 4/2013 | Carre | H02J 7/0068 320/134 |
| 2016/0370430 | A1* | 12/2016 | Jeon | B60L 53/12 |
| 2019/0113582 | A1* | 4/2019 | Chen | H02J 7/0029 |
| 2019/0120912 | A1* | 4/2019 | Chen | H02J 7/0047 |
| 2019/0219640 | A1* | 7/2019 | Liu | H01M 10/425 |
| 2019/0245252 | A1* | 8/2019 | Maki | G01R 31/50 |
| 2019/0305384 | A1* | 10/2019 | Liu | G01R 31/396 |
| 2019/0324086 | A1* | 10/2019 | Yu | G01R 31/50 |
| 2020/0081069 | A1* | 3/2020 | Chen | G01R 31/385 |
| 2020/0099216 | A1* | 3/2020 | Chen | H01M 10/4264 |
| 2020/0274372 | A1* | 8/2020 | Chen | G01R 31/382 |

FOREIGN PATENT DOCUMENTS

| | | |
|---|---|---|
| CN | 104375613 A | 2/2015 |
| CN | 106249833 A | 12/2016 |
| CN | 106532875 A | 3/2017 |
| CN | 106680651 A | 5/2017 |
| CN | 106740132 A | 5/2017 |
| CN | 107271918 A | 10/2017 |
| CN | 107450701 A | 12/2017 |
| JP | 2009289005 A | 12/2009 |
| JP | 2015219188 A | 12/2015 |
| JP | 2017204978 A | 11/2017 |
| KR | 19980084047 A | 12/1998 |
| KR | 100845320 B1 | 7/2008 |
| TW | 200928392 A | 7/2009 |
| WO | 2011160258 A1 | 12/2011 |
| WO | 2017095066 A1 | 6/2017 |

OTHER PUBLICATIONS

First Examination Report issued in corresponding IN application No. 201917020401 dated Nov. 27, 2020.
Notice of Reasons for Refusal with English Translation issued in corresponding JP application No. 2020-503977 dated Feb. 2, 2021.
The first office action with English Translation issued in corresponding CN application No. 201880038768 dated Feb. 3, 2021.
Notification of Reason with English Translation for Refusal issued in corresponding KR application No. 10-2020-7002489 dated Feb. 18, 2021.

* cited by examiner

FIG. 1

DETECTING POWER CONSUMPTION OF A BATTERY OF A TERMINAL DEVICE, UPON DETERMINING THAT THE TERMINAL DEVICE IS FULLY CHARGED AND REMAINS COUPLED WITH THE ADAPTER AND AT LEAST ONE POWER-CONSUMING COMPONENT OF THE TERMINAL DEVICE IS IN A NON-WORKING STATE, THE AT LEAST ONE POWER-CONSUMING COMPONENT IS POWERED BY THE BATTERY WHEN THE TERMINAL DEVICE IS FULLY CHARGED AND REMAINS COUPLED WITH THE ADAPTER — S1

DETERMINING WHETHER THE TERMINAL DEVICE EXPERIENCES LEAKAGE ACCORDING TO THE POWER CONSUMPTION OF THE BATTERY — S2

TERMINAL DEVICE, METHOD FOR LEAKAGE DETECTION THEREFOR

CROSS-REFERENCE TO RELATED APPLICATION(S)

This application is a continuation of International Application No. PCT/CN2018/074938, filed on Feb. 1, 2018, the disclosure of which is hereby incorporated by reference in its entirety.

TECHNICAL FIELD

This disclosure relates to the technical field of terminal devices, and more particularly to a method for leakage detection for a terminal device, a terminal device, an apparatus for leakage detection for a terminal device, and a terminal device with the apparatus for leakage detection.

BACKGROUND

At present, mobile phones, tablet computers, etc. have become an indispensable part of our daily life, bringing great convenience to our life. However, due to the limited service life of internal electronic components, after a period of time, leakage (that is, electric current leakage) may occur to the internal electronic components due to aging, thus causing leakage in the mobile phones, the tablet computers, etc.; alternatively, leakage may occur to the internal electronic components due to external environmental factors or human factors, for example, the mobile phones, the tablet computers, etc. have been in a humid environment for a long time or accidentally dropped or hit, which may also result in the leakage in the mobile phones, the tablet computers, etc. However, when the leakage occurs, most users are not aware of it, causing the mobile phones, the tablet computers, etc. to completely discharge without the user's awareness, which seriously affects people's life.

SUMMARY

A first aspect of the disclosure provides a method for leakage detection of a terminal device. The method includes the following. Power consumption of a battery of a terminal device is detected, upon determining that the terminal device is fully charged and remains coupled with the adapter and at least one power-consuming component of the terminal device is in a non-working state, the at least one power-consuming component is powered by the battery when the terminal device is fully charged and remains coupled with the adapter. Whether the terminal device experiences leakage is determined according to the power consumption of the battery.

According to a second aspect of the present disclosure, there is provided a terminal device. The terminal device include a batter, at least one power-consuming component, a detecting circuit, and a processor. The at least one power-consuming component is powered by the battery when the terminal device is fully charged by an adapter and remains coupled with the adapter. The detecting circuit is configured to detect power consumption of the battery when the at least one power-consuming component is in a non-working state. The processor is coupled with the detecting circuit and configured to determine whether the terminal device experiences leakage according to the power consumption detected.

According to a third aspect of the present disclosure, there is provided a terminal device. The terminal device includes a battery, a processor, and a memory coupled with the processor and configured to store program codes. The program codes are operable with the processor to carry out a leakage detection procedure when executed by the processor. The leakage detection procedure includes the following. Power consumption of the battery is detected, upon determining that the terminal device is fully charged and remains coupled with the adapter and at least one power-consuming component of the terminal device is in a non-working state, the at least one power-consuming component being powered by the battery when the terminal device is fully charged and remains coupled with the adapter. Whether the terminal device experiences leakage is determined according to the power consumption of the battery.

DETAILED DESCRIPTION

Implementations of the present disclosure will be further described below with reference to the accompanying drawings, where the same or similar reference numerals denote the same or similar elements or elements with the same or similar functions. It will be appreciated that the implementations described hereinafter with reference to the accompanying drawings are illustrative and for the purpose of explanation rather than restriction of the disclosure.

A method for leakage detection for a terminal device, a non-transitory computer readable storage medium, a terminal device, an apparatus for leakage detection for a terminal device, and a terminal device with the apparatus for leakage detection according to the implementations of the present disclosure are described below with reference to the accompanying drawings.

It should be noted that, in implementations of the present disclosure, the "terminal device" can include but is not limited to a device configured via a wired line and/or a wireless interface to receive/transmit communication signals. Examples of the wired line may include, but are not limited to, at least one of a public switched telephone network (PSTN), a digital subscriber line (DSL), a digital cable, a direct connection cable, and/or another data connection line or network connection line. Examples of the wireless interface may include, but are not limited to, a wireless interface with a cellular network, a wireless local area network (WLAN), a digital television network (such as a digital video broadcasting-handheld (DVB-H) network), a satellite network, an AM-FM broadcast transmitter, and/or with another communication terminal. A communication terminal configured to communicate via a wireless interface may be called a "wireless communication terminal", a "wireless terminal", and/or a "mobile terminal". Examples of a mobile terminal may include, but are not limited to, a satellite or cellular telephone, a personal communication system (PCS) terminal capable of cellular radio telephone, data processing, fax, and/or data communication, a personal digital assistant (PDA) equipped with radio telephone, pager, Internet/Intranet access, web browsing, notebook, calendar, and/or global positioning system (GPS) receiver, and/or other electronic devices equipped with radio telephone capability such as a conventional laptop or a handheld receiver.

Figure 1:
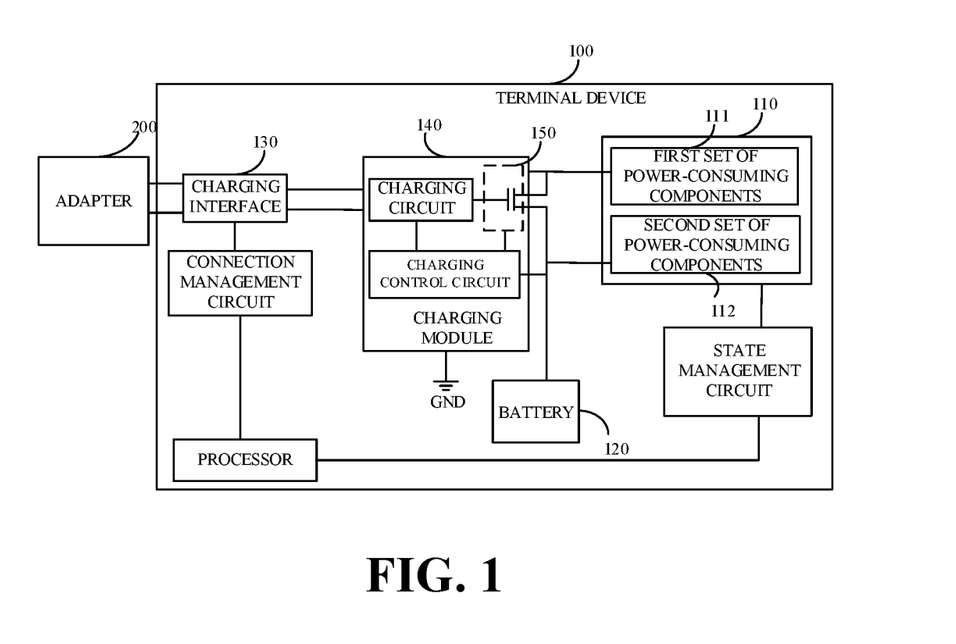
FIG. 1 is a schematic structural diagram illustrating a terminal device according to an implementation of the present disclosure.

In implementations of the present disclosure, as illustrated in FIG. 1, the terminal device 100 includes multiple power-consuming components 110 divided into a first set and a second set. When the terminal device 100 is fully charged and remains coupled with an adapter 200, the first set of power-consuming components 111 is powered by the adapter 200 and the second set of power-consuming components 112 is powered by a battery 120 of the terminal device 100. The first or second set of power-consuming components can each be one or more than one power consuming components.

In an implementation of the present disclosure, the first set of power-consuming components 111 includes a processor and a control integrated circuit (IC) of the terminal device 100, and the second set of power-consuming components 112 includes a communication network component and a display component of the terminal device 100. The present disclosure relates to the detection associated with the second set of power-consuming components 112. It should be noted that, we here user the term "the first set" and the "the second set" to distinguish some components from the rest. Division of the first set and the second set of power-consuming components can be pre-set when the terminal device leaves the factory, can be set by the user after purchase, or by an application for implementing the technical solution provided herein, such application can be build in or downloaded to the terminal device.

That is to say, after the terminal device 100 is fully charged, the adapter 200 stops charging the terminal device 100. At this time, if a user does not pull out the adapter 200, main power-consuming components of the terminal device 100 have two power supply circuits. A part of the power-consuming components, for example, a communication network component composed of a 2G/4G radio frequency power amplifier (simplified as 2G/4G PA) and the like, a liquid crystal display component, etc., are powered by the battery 120. The remaining power-consuming components, for example, a central processing unit (CPU), a control chip, and the like of the terminal device 100, are directly powered by the adapter 200. The manner in which the components are powered can be set according to different terminal devices 100.

As shown in FIG. 1, in addition to the multiple power-consuming components 110 and the battery 120, the terminal device 100 further includes a charging interface 130, a charging module 140, and a charging control switch 150. The charging interface 130 can be a wired charging interface or a wireless charging interface. In the case that the charging interface 130 is a wired charging interface, the charging interface 130 can be a universal serial bus (USB) interface, through which the terminal device 100 can be coupled with the adapter 200. The USB interface can be a normal USB interface or a micro USB interface. In the case that the charging interface 130 is a wireless charging interface, the charging interface 130 can be a wireless power receiving coil. The wireless power receiving coil matches (in other words, cooperates) a wireless power transmitting coil in the adapter 200 to receive power through electromagnetic induction. Alternatively, the charging interface 130 can be a receiving antenna. The receiving antenna matches a transmitting antenna in the adapter 200 to receive power through radio waves. The charging interface 130 can also be a coupling electrode or a coil with the same vibration frequency, etc., which can be chosen according to actual needs.

The terminal device 100 may further includes a connection management circuit. The connection management circuit can be configured to detect connection of the charging interface, such as whether the terminal device is coupled with the power adapter via the charging interface, or whether the adapter has been pulled out of the charging interface. A state management circuit may be further provided. The state management circuit is configured to detect the state of the second set of power-consuming component, for example, to detect whether the at least one power-consuming component is in a working state or not. The connection management circuit and the state management circuit can be provided separately, or, one or both of them can be integrated into a processor.

The charging module 140 can include a charging circuit or a charging control circuit. The charging circuit has one end coupled with the charging interface 130, and the other end respectively coupled with the multiple power-consuming components 110 and the battery 120 through the charging control switch 150. The charging control circuit is respectively coupled with the charging interface 130, the charging circuit, the charging control switch 150, the battery 120, and the processor of the terminal device 100. The charging control circuit is configured to detect a voltage of the battery 120 to determine whether the battery 120 needs to be charged. When the battery 120 needs to be charged, if the terminal device 100 is in a power-on state and the user connects the adapter 200 to the charging interface 130, the charging control circuit will generate a charging interrupt signal to the processor of the terminal device 100. After receiving the charging interrupt signal, the processor of the terminal device 100 executes a charging procedure and outputs a charging control signal to the charging control circuit. According to the charging control signal, the charging control circuit controls the charging control switch 150, so as to charge the battery 120 and power the multiple power-consuming components 110 respectively via the charging circuit, and meanwhile the charging control circuit detects in real time a charging state of the battery 120. When the battery 120 is fully charged, the charging control circuit controls the charging control switch 150, so as to stop charging the battery 120 via the charging control switch 150, and the charging control circuit further determines whether the adapter 200 is pulled out of the charging interface 130. If the adapter 200 is pulled out of the charging interface 130, the charging control circuit controls the charging circuit to stop working, and controls, through the charging control switch 150, the battery 120 to power the multiple power-consuming components 110; otherwise, the charging control circuit controls the charging circuit to continue to power the first set of power-consuming components 111 of the multiple power-consuming components 110, whereas the charging control circuit controls the battery 120 to power the second set of power-consuming components 112.

If the terminal device 100 is in a power-off state, when the user connects the adapter 200 to the charging interface 130, the charging control circuit starts to detect or measure the voltage of the battery 120, to determine whether the battery 120 needs to be charged. If so, the charging control circuit controls the charging circuit to work and power the first set of power-consuming components 111 of the multiple power-consuming components 110 by controlling the charging control switch 150, and meanwhile the charging control circuit generates a reset signal and a charging interrupt signal to the processor of the terminal device 100. The subsequent charging process is the same as that in the case where the terminal device 100 is in the power-on state, which will not be described in detail herein. As such, charging of the battery 120 and powering of the multiple power-consuming components 110 can be achieved through the charging module 140. The charging control switch 150 is a switch circuit composed of electronic switch components. For example, the charging control switch 150 may be a metal oxide semiconductor (MOS) transistor. The MOS transistor has a first end coupled with an anode of the charging circuit and an anode of the first set of power-consuming components 111 respectively, a second end coupled with an anode of the battery 120 and an anode of the second set of power-consuming components 112 respectively, and a control end coupled with the charging control circuit. When the charging control circuit detects that the adapter 200 is coupled with the charging interface 130 and the battery 120 needs to be charged, the charging control circuit controls the MOS transistor to be in an ON state. In this case, the charging circuit charges the battery 120 and powers the first set of power-consuming components 111 and the second set of power-consuming components 112. When the charging control circuit detects that the adapter 200 is coupled with the charging interface 130 but the battery 120 does not need to be charged, the charging control circuit controls the MOS transistor to be in an OFF state. In this case, while the first set of power-consuming components 111 is still powered by the charging circuit, the second set of power-consuming components 112 is powered by the battery 120. When the charging control circuit detects that the adapter 200 is not coupled with the charging interface 130, the charging control circuit controls the MOS transistor to be in an ON state. In this case, the battery 120 powers the first set of power-consuming components 111 and the second set of power-consuming components 112.

That is to say, during charging of the terminal device 100, the first set of power-consuming components 111 and the second set of power-consuming components 112 are powered by the adapter 200; when the terminal device 100 is fully charged and remains coupled with the adapter 200, the first set of power-consuming components 111 is powered by the adapter 200 and at the same time the second set of power-consuming components 112 is powered by the battery 120; when the terminal device 100 is disconnected from the adapter 200, the first set of power-consuming components 111 and the second set of power-consuming components 112 are powered by the battery 120. Since the second set of power-consuming components 112 is powered by the battery 120 whereas the first set of power-consuming components 111 is powered by the adapter 200 when the terminal device 100 is fully charged and remains coupled with the adapter 200, if the second set of power-consuming components 112 is not working, whether the second set of power-consuming components 112 experiences leakage can be determined according to power consumption of the battery 120, specifically, information indicative of power consumption of the battery 120, thereby determining that leakage in the terminal device 100 is caused by the leakage in the second set of power-consuming components 112. By dividing the power-consuming components into two sets, one set is powered by the adapter and another set powered by the battery when the terminal device is fully charged and remains coupled with the power adapter, not only can serious leakage in the terminal device caused by the second set of power-consuming components 112 be detected, but also slight leakage in the terminal device can be detected, thereby ensuring detection reliability.

Figure 2:
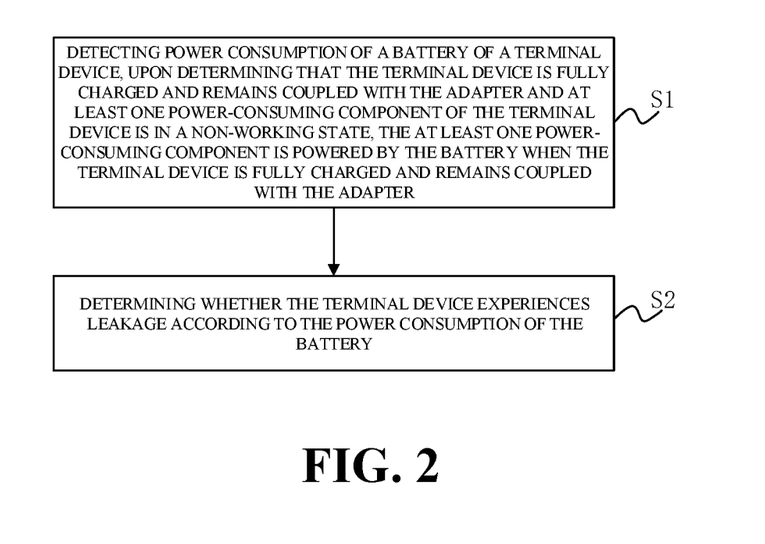
FIG. 2 is a flowchart illustrating a method for leakage detection for a terminal device according to an implementation of the present disclosure.

FIG. 2 is a flowchart illustrating a method for leakage detection for a terminal device according to an implementation of the present disclosure. As illustrated in FIG. 2, the method includes the following.

At S1, when the terminal device is fully charged and remains coupled with the adapter, if the second set of power-consuming components is in a non-working state, detect power consumption of a battery, for example, information indicative of power consumption of a battery is obtained.

In some implementations, the information indicative of power consumption of the battery is obtained by detecting at least one of voltage variation of the battery and current consumption of the battery. The current consumption of the battery refers to a current in a loop where the battery is arranged when the battery consumes power.

In an implementation, a voltage of the battery can be detected through a voltage detecting circuit, and then the information indicative of power consumption of the battery can be obtained according to the voltage variation of the battery. For example, within a time period, if the voltage of the battery drops quickly, it indicates that power consumption of the battery is serious; if the voltage of the battery drops slowly, it indicates that power consumption of the battery is slow; if nearly no change occurs to the voltage of the battery, it indicates that there is nearly no power consumption in the battery. An voltage variation threshold can also be introduced. If the voltage variation detected in a time period is greater than the threshold, it indicates that power consumption of the battery is serious, otherwise, the situation may be not too bad.

Alternatively, the current consumption of the battery can be detected through a current detecting circuit, and then the information indicative of power consumption of the battery can be obtained according to the current consumption of the battery. For example, if the current consumption of the battery is great, power consumption of the battery is serious; if the current consumption of the battery is small, power consumption of the battery is slow; if the current consumption of the battery is tiny or is approximately zero, there is nearly no power consumption in the battery. Alternatively, the voltage of the battery is detected through the voltage detecting circuit and the current consumption of the battery is detected through the current detecting circuit, and then the information indicative of power consumption of the battery can be obtained according to the voltage variation of the battery and the current consumption of the battery, thereby ensuring accuracy of the power consumption obtained.

Figure 3:
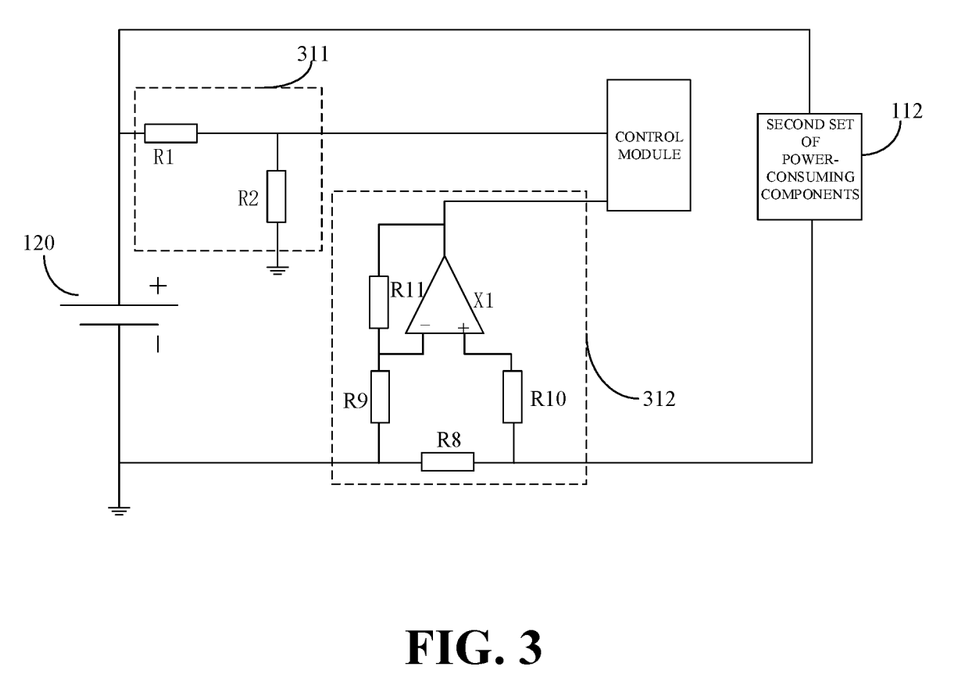
FIG. 3 is a schematic structural diagram illustrating circuits for voltage detection of a battery and current consumption detection of the battery according to an implementation of the present disclosure.

The voltage detecting circuit and the current detecting circuit can adopt a circuit configuration illustrated in FIG. 3. As illustrated in FIG. 3, the voltage detecting circuit 311 includes a first resistor R1 and a second resistor R2. The first resistor R1 has one end coupled with an anode of the battery 120. The second resistor R2 has one end coupled with the other end of the first resistor R1 at a first node. The second resistor R2 has the other end grounded. The first node serves as an output end of the voltage detecting circuit 311.

The current detecting circuit 312 includes an eighth resistor R8, a ninth resistor R9, a tenth resistor R10, a first amplifier X1, and an eleventh resistor R11. The eighth resistor R8 has one end coupled with a cathode of the battery 120, and the other end coupled with the anode of the battery 120 through the second set of power-consuming components 112. The eighth resistor R8 is a current detecting resistor. The ninth resistor R9 has one end coupled with the one end of the eighth resistor R8, and the tenth resistor R10 has one end coupled with the other end of the eighth resistor R8. The first amplifier X1 has a negative input end coupled with the other end of the ninth resistor R9 and a positive input end coupled with the other end of the tenth resistor R10. The eleventh resistor R11 is coupled between the negative input end of the first amplifier X1 and an output end of the first amplifier X1, and the output end of the first amplifier X1 serves as an output end of the current detecting circuit 312.

As illustrated in FIG. 3, when voltage obtained through the voltage detecting circuit 311 is almost constant (considering detection error), and current obtained by the control module through the current detecting circuit 312 is approximately zero (considering the detection error), the battery 120 has no power consumption. However, when the voltage obtained by the control module through the voltage detecting circuit 311 decreases continuously, or the current consumption obtained by the control module through the current detecting circuit 312 is greater than zero (considering the detection error, a value approximate to zero is adopted), the battery 120 has power consumption.

It should be noted that, the circuit configuration illustrated in FIG. 3 is merely illustrative. In implementations of the present disclosure, other circuit configurations may also be adopted, which are not detailed herein. In addition, when the information indicative of power consumption of the battery is obtained according to the voltage variation of the battery, the current detecting circuit 312 in FIG. 3 can be omitted. When the information indicative of power consumption of the battery is obtained according to the current consumption of the battery, the voltage detecting circuit 311 in FIG. 3 can be omitted. That is, battery power consumption detection can also be achieved with only one parameter, that is, voltage variation or current consumption.

At S2, whether the terminal device experiences leakage is determined according to the information indicative of power consumption of the battery.

In an implementation, when the terminal device is fully charged and remains coupled with the adapter, if the second set of power-consuming components is in the non-working state, normally, the battery has no power consumption. However, if power consumption is detected to occur to the battery, the terminal device experiences leakage. For example, when power consumption of the battery is obtained according to the voltage variation of the battery and the current consumption of the battery, if the voltage of the battery is detected to drop continuously or the current consumption of the battery is detected to be continuously greater than zero and remains in a stable state (i.e., the battery has continuous and stable current consumption), determine that components coupled with the battery experience leakage, and further determine that the terminal device experiences leakage.

According to the method for leakage detection for a terminal device provided herein, when the terminal device is fully charged and remains coupled with the adapter and the second set of power-consuming components is in the non-working state, whether the terminal device experiences leakage can be determined according to the information indicative of power consumption of the battery, thereby effectively solving the problem that the user is not aware of the leakage in the terminal device.

In an implementation, when the terminal device is in a low-power state, the second set of power-consuming components is in the non-working state. In addition, the low-power state includes a screen-off standby state and a power-off state.

The "screen-off standby state" means that the display component of the terminal device is in a screen-off state, and the communication network component and the like are in the non-working state with only core components (e.g., the processor and the control IC) of the system of the terminal device in a working state. The "power-off state" means that all components of the terminal device are in the non-working state, that is, the terminal device is in a state with no power consumption ("no-power consumption state" for short). In short, whether the terminal device is in the screen-off standby state or in the power-off state, when the terminal device is fully charged and coupled with the adapter, the battery of the terminal device is in the no-power consumption state. Therefore, inaccuracy of leakage detection due to the power consumption of battery-powered components, such as the display component, the communication network component, and the like, can be effectively avoided.

For example, as illustrated in FIG. 1, in general, when the terminal device has no power or low power, the user will choose to charge the terminal device. When the terminal device 100 is in the power-on state, if the user connects the adapter 200 to the charging interface 130, the charging control circuit will generate a charging interrupt signal to the processor of the terminal device 100. After receiving the charging interrupt signal, the processor of the terminal device 100 executes a charging procedure and outputs a charging control signal to the charging control circuit. The charging control circuit controls the charging circuit and the charging control switch 150 (e.g. the MOS transistor) according to the charging control signal, so as to charge the battery 120 and power the multiple power-consuming components 110, and meanwhile the charging control circuit detects in real time the charging state of the battery 120.

When the battery 120 is fully charged and the charging interface 130 is coupled with the adapter 200, the charging control circuit controls the charging control switch 150, so as to continue to power the first set of power-consuming components 111 through the charging circuit, whereas the second set of power-consuming components 112 is powered by the battery 120. At the same time, the charging control circuit transmits a leakage detection signal to the processor of the terminal device 100, and the processor of the terminal device 100 starts executing a leakage detection procedure. For example, the charging control circuit can control on/off of the charging control switch, so as to turn on/off a charging path between the power adapter and the first set of power-consuming components, a charging path between the power adapter and the second set of power-consuming components, a charging path between the battery and the first set of power-consuming components, and a charging path between the battery and the second set of power-consuming components.

During execution of the leakage detection procedure, whether the terminal device 100 is in the screen-off standby state is detected, that is, whether the second set of power-consuming components is in the non-working state is detected, and if so, the leakage detection for the terminal device 100 is started. At this time, the voltage variation of the battery and/or the current consumption of the battery are obtained, and then whether the terminal device experiences leakage is determined according to the voltage variation of the battery and/or the current consumption of the battery. For example, within a time period, if the voltage of the battery is detected to decrease continuously, it indicates that the terminal device experiences leakage; for another example, if the battery is detected to have a continuous and stable current consumption, it indicates that the terminal device experiences leakage; for yet another example, if the voltage of the battery is detected to continuously decrease or the battery is detected to have a continuous and stable current consumption, it indicates that the terminal device experiences leakage.

When the terminal device 100 is in the power-off state, if the user connects the adapter 200 to the charging interface 130, the charging control circuit starts to detect the voltage of the battery 120, to determine whether the battery 120 needs to be charged. If so, the charging control circuit controls the charging circuit to work and power the first set of power-consuming components 111 of the multiple power-consuming components 110 by controlling the charging control switch 150, and meanwhile the charging control circuit generates a reset signal and a charging interrupt signal to the processor of the terminal device 100. The processor of the terminal device 100 is started after receiving the reset signal, and executes a charging procedure according to the charging interrupt signal. The subsequent charging process and the leakage detection process are the same as those in the case where the terminal device is in the screen-off standby state, and will not be described in detail herein.

As a result, when the terminal device is fully charged and remains coupled with the adapter, if the second set of power-consuming components is in the non-working state, whether the terminal device experiences leakage can be determined according to the information indicative of power consumption of the battery.

In addition, in an implementation, the method further includes the following. The terminal device is controlled to display the information indicative of power consumption of the battery, and the terminal device is controlled to send out leakage prompt information upon determining that the terminal device experiences leakage.

Figure 4A:
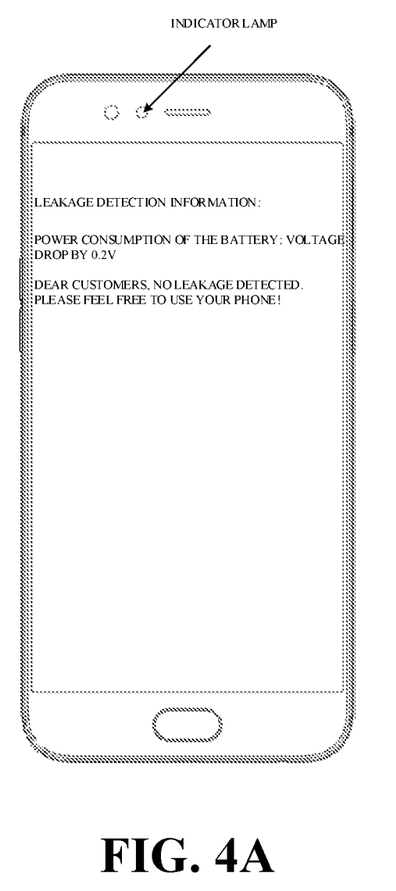
FIG. 4A is a schematic diagram of a prompt message indicative of no leakage in a terminal device according to an implementation of the present disclosure.
Figure 4B:
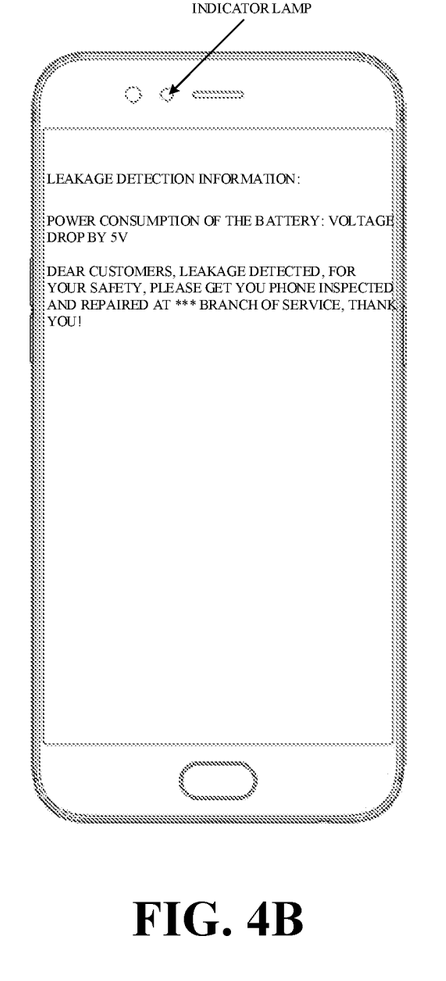
FIG. 4B is a schematic diagram of a prompt message indicative of leakage in a terminal device according to an implementation of the present disclosure.

For example, after the leakage detection of the terminal device is completed, a result regarding leakage detection can also be notified to the user, so that the user can be informed of a present condition of the terminal device in time. For example, after the leakage detection is completed, if there is no leakage in the terminal device, as illustrated in FIG. 4A, the information indicative of power consumption of the battery can be displayed through the display component, and the user can be notified of no leakage in the terminal device and the user can feel free to use the terminal device; if the terminal device experiences leakage, as illustrated in FIG. 4B, the information indicative of power consumption of the battery can be displayed through the display component, and the user can be informed that the terminal device experiences leakage and be reminded to get the terminal device repaired in time. At the same time, the user can also be reminded by flashing of an indicator lamp on the terminal device, for example, control the indicator lamp to flash on red at a high frequency, or the user can be reminded through a speech function of the terminal device.

In normal circumstances, when the user receives the above prompt information, the user will get the terminal device inspected and repaired at a corresponding branch of service. However, some users, without awareness of seriousness of the problem when they receive the message, will probably ignore the prompt message and continue to use the terminal device as usual. Therefore, in this case, the user can be reminded multiple times, for example, the user can be reminded at least three times. If the user still does not deal with the problem after being reminded multiple times, some functions of the terminal device can be restricted in this case. For instance, when the leakage of the terminal device determined according to the voltage variation of the battery is not serious, some components of risk (such as capacitors) may be restricted. However, when the leakage of the terminal device is serious, the terminal device is directly controlled to be powered off and unable to be launched.

In conclusion, according to the method for leakage detection for a terminal device provided herein, when the terminal device is fully charged and remains coupled with the adapter, the first set of power-consuming components of the terminal device is powered by the adapter and the second set of power-consuming components is powered by the battery of the terminal device. In this case, if the second set of power-consuming components is in the non-working state, the information indicative of power consumption of the battery is detected and whether the terminal device experiences leakage is determined according to the information indicative of power consumption of the battery. Therefore, whether the terminal device experiences leakage can be determined according to the information indicative of power consumption of the battery, thereby effectively solving the problem that the user is not aware of the leakage in the terminal device. It is also possible to realize timely alert and repair, thus avoiding safety hazard caused by leakage and the problem of short duration of use, which can greatly improve performance of the terminal device in use.

In addition, implementations of the present disclosure provide a non-transitory computer readable storage medium. The non-transitory computer readable storage medium is configured to store computer programs which, when executed by a processor, are operable with the processor to execute the above method for leakage detection for a terminal device.

With aid of the non-transitory computer readable storage medium provided herein, the non-transitory computer readable storage medium is configured to store the computer programs which, when executed by the processor, are operable with the processor to execute the above method for leakage detection for a terminal device. When the terminal device is fully charged and remains coupled with an adapter, a first set of power-consuming components of the terminal device is powered by the adapter and a second set of power-consuming components is powered by a battery of the terminal device. In this case, if the second set of power-consuming components is in the non-working state, information indicative of power consumption of the battery is detected and whether the terminal device experiences leakage is determined according to the information indicative of power consumption of the battery. Therefore, whether the terminal device experiences leakage can be determined according to the information indicative of power consumption of the battery.

Figure 5:
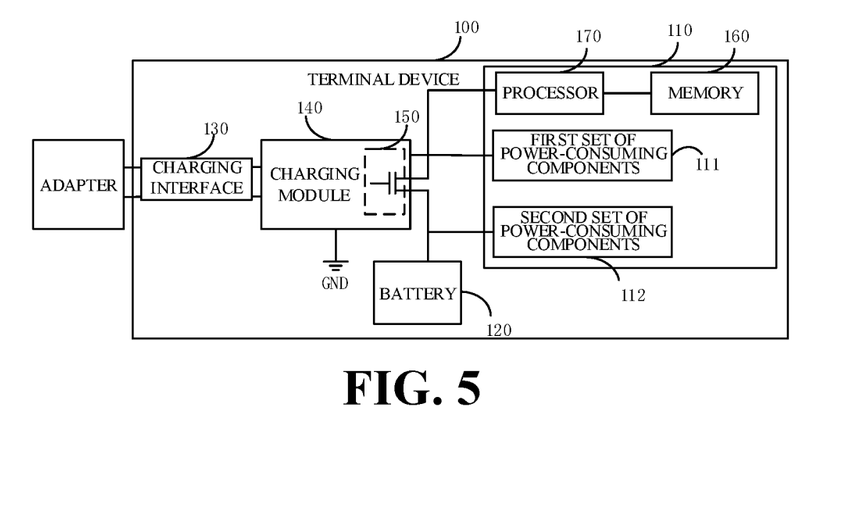
FIG. 5 is a schematic structural diagram illustrating a terminal device according to another implementation of the present disclosure.

Furthermore, implementations of the present disclosure provide a terminal device. As illustrated in FIG. 5, the terminal device 100 includes multiple power-consuming components 110 divided into a first set and a second set. When the terminal device 100 is fully charged and remains coupled with an adapter, the first set of power-consuming components 111 is powered by the adapter and the second set of power-consuming components 112 is powered by a battery 120 of the terminal device 100. The terminal device 100 further includes a memory 160, a processor 170, and a control program of the terminal device 100 stored in the memory 160 and operable with the processor 170. When executed by the processor 170, the control program of the terminal device 100 is configured to execute operations of the above method for leakage detection for a terminal device.

With aid of the terminal device provided herein, by executing the foregoing method for leakage detection for a terminal device, when the terminal device is fully charged and remains coupled with the adapter, the first set of power-consuming components of the terminal device is powered by the adapter and the second set of power-consuming components is powered by the battery of the terminal device. In this case, if the second set of power-consuming components is in the non-working state, the information indicative of power consumption of the battery is detected and whether the terminal device experiences leakage is determined according to the information indicative of power consumption of the battery. Therefore, whether the terminal device experiences leakage can be determined according to the information indicative of power consumption of the battery.

Figure 6:
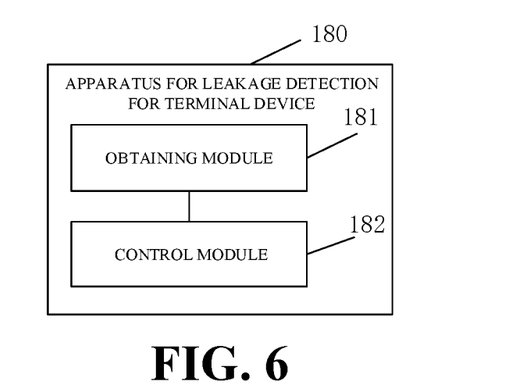
FIG. 6 is a schematic block diagram illustrating an apparatus for leakage detection for a terminal device according to an implementation of the present disclosure.

FIG. 6 is a block diagram illustrating an apparatus for leakage detection for a terminal device according to an implementation of the present disclosure.

In an implementation, as illustrated in FIG. 1, the terminal device 100 includes multiple power-consuming components 110 divided into a first set and a second set. When the terminal device 100 is fully charged and remains coupled with an adapter 200, the first set of power-consuming components 111 is powered by the adapter 200 and the second set of power-consuming components 112 is powered by a battery 120 of the terminal device 100.

In an implementation of the present disclosure, the first set of power-consuming components 111 includes a processor and a control IC of the terminal device 100, and the second set of power-consuming components 112 includes a communication network component and a display component of the terminal device 100.

That is to say, after the terminal device 100 is fully charged, the adapter 200 stops charging the terminal device 100. At this time, if a user does not pull out the adapter 200, main power-consuming components of the terminal device 100 have two power supply circuits. A part of the power-consuming components, for example, a communication network component composed of a 2G/4G radio frequency power amplifier (simplified as 2G/4G PA), a liquid crystal display component, etc., are powered by the battery 120. The remaining power-consuming components, for example, a CPU, a control chip, and the like of the terminal device 100, are directly powered by the adapter 200. The manner in which the components are powered can be customized according to different terminal devices 100.

As shown in FIG. 1, in addition to the multiple power-consuming components 110 and the battery 120, the terminal device 100 includes a charging interface 130, a charging module 140, and a charging control switch 150. The charging interface 130 can be a wired charging interface or a wireless charging interface. In the case that the charging interface 130 is a wired charging interface, the charging interface 130 can be a USB interface, through which the terminal device 100 can be coupled with the adapter 200. The USB interface can be a normal USB interface or a micro USB interface. In the case that the charging interface 130 is a wireless charging interface, the charging interface 130 can be a wireless power receiving coil. The wireless power receiving coil matches a wireless power transmitting coil in the adapter 200 to receive power through electromagnetic induction. Alternatively, the charging interface 130 can be a receiving antenna. The receiving antenna matches a transmitting antenna in the adapter 200 to receive power through radio waves. The charging interface 130 can also be a coupling electrode or a coil with the same vibration frequency, etc., which can be chosen according to actual needs.

The charging module 140 can include a charging circuit or a charging control circuit. The charging circuit has one end coupled with the charging interface 130, and the other end respectively coupled with the multiple power-consuming components 110 and the battery 120 through the charging control switch 150. The charging control circuit is coupled with the charging interface 130, the charging circuit, the charging control switch 150, the battery 120, and the processor of the terminal device 100 respectively. The charging control circuit is configured to detect a voltage of the battery 120 to determine whether the battery 120 needs to be charged. When the battery 120 needs to be charged, if the terminal device 100 is in a power-on state and the user connects the adapter 200 to the charging interface 130, the charging control circuit will generate a charging interrupt signal to the processor of the terminal device 100. After receiving the charging interrupt signal, the processor of the terminal device 100 executes a charging procedure and outputs a charging control signal to the charging control circuit. According to the charging control signal, the charging control circuit uses the charging circuit and the charging control switch 150 to charge the battery 120 and power the multiple power-consuming components 110 respectively, and meanwhile the charging control circuit detects in real time a charging state of the battery 120. When the battery 120 is fully charged, the charging control circuit controls the charging control switch 150, to stop charging the battery 120, and the charging control circuit further determines whether the adapter 200 is pulled out of the charging interface 130. If the adapter 200 is pulled out of the charging interface 130, the charging control circuit controls the charging circuit to stop working, and controls, through the charging control switch 150, the battery 120 to power the multiple power-consuming components 110; otherwise, the charging control circuit controls the charging circuit to continue to power the first set of power-consuming components 111 of the multiple power-consuming components 110, whereas the charging control circuit controls the battery 120 to power the second set of power-consuming components 112.

If the terminal device 100 is in a power-off state, when the user connects the adapter 200 to the charging interface 130, the charging control circuit starts to detect the voltage of the battery 120, to determine whether the battery 120 needs to be charged. If so, the charging control circuit controls the charging circuit to work and power the first set of power-consuming components 111 of the multiple power-consuming components 110 by controlling the charging control switch 150, and meanwhile the charging control circuit generates a reset signal and a charging interrupt signal to the processor of the terminal device 100. The subsequent charging process is the same as that in the case where the terminal device 100 is in the power-on state, which will not be described in detail herein. In this way, charging of the battery 120 and powering of the multiple power-consuming components 110 can be achieved through the charging module 140.

The charging control switch 150 is a switch circuit composed of electronic switch components. For example, the charging control switch 150 may be a MOS transistor. The MOS transistor has a first end coupled with an anode of the charging circuit and an anode of the first set of power-consuming components 111 respectively, a second end coupled with an anode of the battery 120 and an anode of the second set of power-consuming components 112 respectively, and a control end coupled with the charging control circuit. When the charging control circuit detects that the adapter 200 is coupled with the charging interface 130 and the battery 120 needs to be charged, the charging control circuit controls the MOS transistor to be in an ON state. In this case, the charging circuit charges the battery 120 and powers the first set of power-consuming components 111 and the second set of power-consuming components 112. When the charging control circuit detects that the adapter 200 is coupled with the charging interface 130 but the battery 120 does not need to be charged, the charging control circuit controls the MOS transistor to be in an OFF state. In this case, while the first set of power-consuming components 111 is still powered by the charging circuit, the second set of power-consuming components 112 is powered by the battery 120. When the charging control circuit detects that the adapter 200 is not coupled with the charging interface 130, the charging control circuit controls the MOS transistor to be in an ON state. In this case, the battery 120 powers the first set of power-consuming components 111 and the second set of power-consuming components 112.

That is to say, during charging the terminal device 100, the first set of power-consuming components 111 and the second set of power-consuming components 112 are powered by the adapter 200; when the terminal device 100 is fully charged and remains coupled with the adapter 200, the first set of power-consuming components 111 is powered by the adapter 200, and at the same time the second set of power-consuming components 112 is powered by the battery 120; when the terminal device 100 is disconnected from the adapter 200, the first set of power-consuming components 111 and the second set of power-consuming components 112 are powered by the battery 120. When the terminal device 100 is fully charged and remains coupled with the adapter 200, the second set of power-consuming components 112 is powered by the battery 120, whereas the first set of power-consuming components 111 is powered by the adapter 200. In this case, if the second set of power-consuming components 112 is not working, whether there is leakage in the second set of power-consuming components 112 can be determined according to information indicative of power consumption of the battery 120, thereby determining leakage in the terminal device 100 caused by the leakage in the second set of power-consuming components 112. In addition, as the first set of power-consuming components 111 is powered by the adapter 200, power-consuming components for leakage detection for the terminal device 100 can be distributed into the first set of power-consuming components 111, that is, the power-consuming components for leakage detection for the terminal device 100 are powered by the adapter 200. In this case, not only can serious leakage in the terminal device caused by the second set of power-consuming components 112 be detected, but also slight leakage in the terminal device can be detected, thereby ensuring detection reliability.

As illustrated in FIG. 6, the apparatus 180 for leakage detection for a terminal device includes an obtaining module 181 and a control module 182. The obtaining module 181 is configured to obtain the information indicative of power consumption of the battery 120. The control module 182 is configured to determine whether the terminal device experiences leakage 100 according to the information indicative of power consumption of the battery 120, on condition that the second set of power-consuming components 112 is in a non-working state, when the terminal device 100 is fully charged and remains coupled with the adapter 200. The modules mentioned above can be integrated into a processor, such as the processor illustrated in FIG. 1 and FIG. 5.

In an implementation, the obtaining module 181 is configured to obtain the information indicative of power consumption of the battery 120 by detecting at least one of voltage variation of the battery 120 and current consumption of the battery 120. The current consumption of the battery refers to a current in a loop where the battery is arranged when the battery consumes power.

In an implementation, the obtaining module 181 can be configured to detect a voltage of the battery through a voltage detecting circuit, and to obtain the information indicative of power consumption of the battery according to the voltage variation of the battery. For example, within a time period, if the voltage of the battery drops quickly, the battery consumes much power; if the voltage of the battery drops slowly, the battery consumes less power; if the voltage of the battery barely changes, the battery consumes almost no power. Alternatively, the current consumption of the battery can be detected through a current detecting circuit, and then the information indicative of power consumption of the battery can be obtained according to the current consumption of the battery. For example, if the current consumption of the battery is great, power consumption of the battery is serious; if the current consumption of the battery is small, power consumption of the battery is slow; if the current consumption of the battery is tiny or approximately zero, the battery has nearly no power consumption. Alternatively, the voltage of the battery is detected through the voltage detecting circuit and the current consumption of the battery is detected through the current detecting circuit, and then the information indicative of power consumption of the battery can be obtained according to the voltage variation of the battery and the current consumption of the battery, thereby ensuring accuracy of acquiring the information indicative of power consumption of the battery. The voltage detecting circuit and the current detecting circuit can adopt a circuit configuration illustrated in FIG. 3, which will not be repeated herein.

When the terminal device 100 is fully charged and remains coupled with the adapter 200, if the second set of power-consuming components 112 is in the non-working state, normally, the battery 120 has no power consumption. However, if the battery 120 is detected to have power consumption, the terminal device experiences leakage 100. For example, when the information indicative of power consumption of the battery 120 is obtained according to the voltage variation of the battery 120 and the current consumption of the battery 120, if the voltage of the battery 120 is detected to drop continuously or the current consumption of the battery 120 is continuously greater than zero and remains stable (i.e., the battery 120 has continuous and stable current consumption), determine that there is leakage in components coupled with the battery 120, and further determine that there is leakage in the terminal device 100.

With aid of the apparatus for leakage detection for a terminal device provided herein, when the terminal device is fully charged and remains coupled with the adapter, if the second set of power-consuming components is in the non-working state, whether the terminal device experiences leakage can be determined according to the information indicative of power consumption of the battery, thereby effectively solving the problem of the leakage in the terminal device which is unknown to the user.

In an implementation, when the terminal device 100 is in a low-power state, the second set of power-consuming components 112 is in the non-working state. In addition, the low-power state includes a screen-off standby state and a power-off state.

The "screen-off standby state" means that the display component of the terminal device 100 is in a screen-off state, and the communication network component and the like are in the non-working state with only core components (e.g., the processor and the control IC) of the system of the terminal device in a working state. The "power-off state" means that all components of the terminal device are in the non-working state, that is, the terminal device is in a state with no power consumption ("no-power consumption state" for short). For short, whether the terminal device is in the screen-off standby state or in the power-off state, when the terminal device is fully charged and coupled with the adapter, the battery of the terminal device is in the no-power consumption state. Therefore, inaccurate leakage detection due to the power consumption of battery-powered components, such as the display component, the communication network component, and the like, can be effectively avoided.

For example, as illustrated in FIG. 1, in general, when the terminal device 100 has no power or low power, the user will choose to charge the terminal device. When the terminal device 100 is in the power-on state, if the user connects the adapter 200 to the charging interface 130, the charging control circuit will generate a charging interrupt signal to the processor of the terminal device 100. After receiving the charging interrupt signal, the processor of the terminal device 100 executes a charging procedure and outputs a charging control signal to the charging control circuit. The charging control circuit controls the charging circuit and the charging control switch 150 (e.g. the MOS transistor) according to the charging control signal, so as to charge the battery 120 and power the multiple power-consuming components 110, and meanwhile the charging control circuit detects in real time the charging state of the battery 120.

When the battery 120 is fully charged and the charging interface 130 is coupled with the adapter 200, the charging control circuit controls the charging circuit and the charging control switch 150, so as to continue to power the first set of power-consuming components 111 through the charging circuit, whereas the second set of power-consuming components 112 is powered by the battery 120. At the same time, the charging control circuit transmits a leakage detection signal to the control module 182, and the control module 182 starts executing a leakage detection procedure.

During execution of the leakage detection procedure, the control module 182 first detects whether the terminal device 100 is in the screen-off standby state, that is, whether the second set of power-consuming components 112 is in the non-working state, and if so, the control module 182 starts the leakage detection for the terminal device 100. At this time, the obtaining module 181 obtains the voltage variation of the battery 120 and/or the current consumption of the battery 120, and then the control module 182 determines whether the terminal device experiences leakage 100 according to the voltage variation of the battery 120 and/or the current consumption of the battery 120. For example, within a time period, if the voltage of the battery 120 is detected to decrease continuously, it indicates that the terminal device experiences leakage 100; for another example, if the battery 120 is detected to have a continuous and stable current consumption, it indicates that the terminal device experiences leakage 100; for yet another example, if it is detected that the voltage of the battery 120 continuously decreases or the battery 120 has a continuous and stable current consumption, it indicates that the terminal device experiences leakage 100.

When the terminal device 100 is in the power-off state, if the user connects the adapter 200 to the charging interface 130, the charging control circuit starts to detect the voltage of the battery 120, to determine whether the battery 120 needs to be charged. If so, the charging control circuit controls the charging circuit to work and power the first set of power-consuming components 111 of the multiple power-consuming components 110 by controlling the charging control switch 150, and meanwhile the charging control circuit generates a reset signal and a charging interrupt signal to the processor of the terminal device 100. The processor of the terminal device 100 is started after receiving the reset signal, and executes a charging procedure according to the charging interrupt signal. The subsequent charging process and the leakage detection process are the same as those in the case where the terminal device is in the screen-off standby state, which will not be described in detail herein.

As a result, when the terminal device is fully charged and remains coupled with the adapter, if the second set of power-consuming components is in the non-working state, whether the terminal device experiences leakage can be determined according to the information indicative of power consumption of the battery.

In addition, in an implementation, the control module 182 is further configured to control the terminal device 100 to display the information indicative of power consumption of the battery 120, and to control the terminal device 100 to send out leakage prompt information upon determining that the terminal device experiences leakage 100.

For example, after completing the leakage detection of the terminal device 100, the control module 182 can also notify a result regarding leakage detection to the user, so that the user can be informed of a present condition of the terminal device 100 in time. For example, after the leakage detection is completed, if there is no leakage in the terminal device 100, as illustrated in FIG. 4A, the control module 182 can display the information indicative of power consumption of the battery 120 through the display component, and notify the user no leakage is detected in the terminal device 100 and the user can feel free to use the terminal device; if the terminal device 100 experiences leakage, as illustrated in FIG. 4B, the control module 182 can display the information indicative of power consumption of the battery 120 through the display component, inform the user that the terminal device 100 experiences leakage, and remind the user to get the terminal device 100 repaired in time. At the same time, the user can also be reminded by flashing of an indicator lamp on the terminal device 100, for example, control the indicator lamp to flash on red at a high frequency, or the user can be reminded by a speech function in the terminal device 100.

In normal circumstances, when the user receives the above alert information, the user will get the terminal device inspected and repaired at a corresponding branch of service in time. However, some users, without awareness of seriousness of the problem when they receive the message, will probably ignore the message and continue to use the terminal device as usual. Therefore, in this case, the user can be reminded multiple times, for example, the user can be reminded at least three times. If the user still does not deal with the problem after being reminded multiple times, some functions of the terminal device 100 can be restricted in this case. For example, when the leakage of the terminal device 100 determined according to the voltage variation of the battery 120 is not serious, some components of risk (such as capacitors) may be restricted; when the leakage of the terminal device 100 is serious, the terminal device 100 is directly controlled to be powered off and unable to be launched.

With aid of the apparatus for leakage detection for a terminal device provided herein, when the terminal device is fully charged and remains coupled with the adapter, the first set of power-consuming components of the terminal device is powered by the adapter and the second set of power-consuming components is powered by the battery of the terminal device. In this case, if the second set of power-consuming components is in the non-working state, the control module determines whether the terminal device experiences leakage according to the information indicative of power consumption of the battery obtained by the obtaining module. Therefore, whether the terminal device experiences leakage can be determined according to the information indicative of power consumption of the battery. It is also possible to realize timely alert and repair, thus avoiding safety hazard caused by leakage and the problem of short duration of use, which can greatly improve performance of the terminal device in use.

Figure 7:
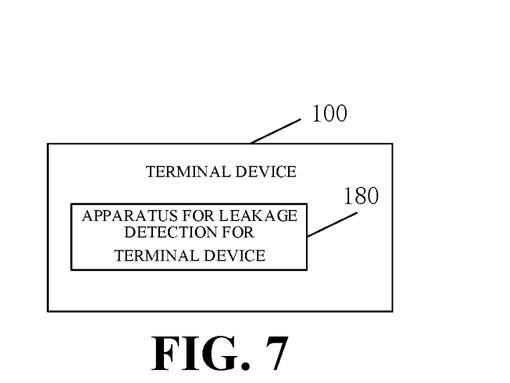
FIG. 7 is a schematic structural diagram illustrating a terminal device according to yet another implementation of the present disclosure.

Moreover, implementations of the present disclosure provide a terminal device. As illustrated in FIG. 7, the terminal device 100 includes the foregoing apparatus 180 for leakage detection.

With aid of the terminal device provided herein, with adoption of the above apparatus for leakage detection for a terminal device, when the terminal device is fully charged and remains coupled with the adapter, the first set of power-consuming components of the terminal device is powered by the adapter and the second set of power-consuming components is powered by the battery of the terminal device. In this case, if the second set of power-consuming components is in the non-working state, the information indicative of power consumption of the battery is detected and whether the terminal device experiences leakage is determined according to the information indicative of power consumption of the battery. Therefore, whether the terminal device experiences leakage can be determined according to the information indicative of power consumption of the battery.

It should be understood that terms such as "center", "longitudinal", "lateral", "length", "width", "thickness", "on", "under", "front", "back", "left", "right", "vertical", "horizontal", "top", "bottom", "in", "out", "clockwise", "anticlockwise", "axial", "radial", "circumferential", and the like referred to herein which indicate directional relationship or positional relationship are directional relationship or positional relationship based on accompanying drawings and are only for the convenience of description and simplicity, rather than explicitly or implicitly indicate that apparatuses or components referred to herein must have a certain direction or be configured or operated in a certain direction and therefore cannot be understood as limitation on the disclosure.

In addition, terms "first", "second", and the like are only used for description and cannot be understood as explicitly or implicitly indicating relative importance or implicitly indicating the number of technical features referred to herein. Therefore, features restricted by terms "first", "second", and the like can explicitly or implicitly include at least one of the features. In the context of the disclosure, unless stated otherwise, "multiple" refers to "at least two", such as two, three, and the like.

Unless stated otherwise, terms "installing", "coupling", "connecting", "fixing", and the like referred to herein should be understood in broader sense. For example, coupling may be a fixed coupling, a removable coupling, or an integrated coupling, may be a mechanical coupling, an electrical coupling, and may be a direct coupling, an indirect coupling through a medium, or a communication coupling between two components or an interaction coupling between two components. For those of ordinary skill in the art, the above terms in the present disclosure can be understood according to specific situations.

Unless stated otherwise, a first feature being "on" or "under" a second feature referred to herein can refer to a direct contact between the first feature and the second feature or an indirect contact between the first feature and the second feature via a medium. In addition, the first feature being "above", "over", and "on" the second feature can be the first feature being right above or obliquely above the second feature or only refers to the first feature being at higher horizontal level than the second feature. The first feature being "below", "underneath", and "under" the second feature can be the first feature being right below or obliquely below the second feature or only refers to the first feature being at lower horizontal level than the second feature.

The reference term "an embodiment", "some embodiments", "implementation", "specific implementation", or "some implementations" referred to herein means that a particular feature, structure, material, or characteristic described in conjunction with the embodiment or implementation may be contained in at least one embodiment or implementation of the present disclosure. The phrase appearing in various places in the specification does not necessarily refer to the same embodiment or implementation. The particular feature, structure, material, or characteristic described may be properly combined in any one or more embodiments or implementations. In addition, when the embodiment or implementation is not mutually exclusive with other embodiments or implementations, it is expressly and implicitly understood by those skilled in the art that an embodiment described herein may be combined with other embodiments or implementations.

Those of ordinary skill in the art will appreciate that units and algorithmic operations of various examples described in connection with implementations herein can be implemented by electronic hardware or by a combination of computer software and electronic hardware. Whether these functions are performed by means of hardware or software depends on the application and the design constraints of the associated technical solution. A professional technician may use different methods with regard to each particular application to implement the described functionality, but such methods should not be regarded as lying beyond the scope of the disclosure.

It will be evident to those skilled in the art that the corresponding processes of the above method implementations can be referred to for the working processes of the foregoing systems, apparatuses, and units, for purposes of convenience and simplicity and will not be repeated herein. It will be appreciated that the systems, apparatuses, and methods disclosed in implementations herein may also be implemented in various other manners. For example, the above apparatus implementations are merely illustrative, e.g., the division of units (including sub-units) is only a division of logical functions, and there may exist other ways of division in practice, e.g., multiple units (including sub-units) or components may be combined or may be integrated into another system, or some features may be ignored or not included. In other respects, the coupling or direct coupling or communication connection as illustrated or discussed may be an indirect coupling or communication connection through some interface, device or unit, and may be electrical, mechanical, or otherwise.

Separated units (including sub-units) as illustrated may or may not be physically separated. Components or parts displayed as units (including sub-units) may or may not be physical units, and may reside at one location or may be distributed to multiple networked units. Some or all of the units (including sub-units) may be selectively adopted according to practical needs to achieve desired objectives of the disclosure. Additionally, various functional units (including sub-units) described in implementations herein may be integrated into one processing unit or may be present as a number of physically separated units, and two or more units may be integrated into one.

If the integrated units are implemented as software functional units and sold or used as standalone products, they may be stored in a computer readable storage medium. Based on such an understanding, the essential technical solution, or the portion that contributes to the prior art, or all or part of the technical solution of the disclosure may be embodied as software products. Computer software products can be stored in a storage medium and may include multiple instructions that, when executed, can cause a computing device, e.g., a personal computer, a server, a second adapter, a network device, etc., to execute some or all operations of the methods as described in the various implementations. The above storage medium may include various kinds of media that can store program code, such as a USB flash disk, a mobile hard drive, a read-only memory (ROM), a random access memory (RAM), a magnetic disk, or an optical disk.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A method for leakage detection for a terminal device, the method comprising:
   detecting power consumption of a battery of a terminal device, upon determining that the terminal device is fully charged and remains coupled with an adapter; and at least one power-consuming component of the terminal device is in a non-working state, the at least one power-consuming component being powered by the battery when the terminal device is fully charged and remains coupled with the adapter; and
   determining whether the terminal device experiences leakage according to the power consumption of the battery.

2. The method of claim 1, wherein the power consumption refers to at least one of voltage variation of the battery and current consumption of the battery.

3. The method of claim 2, wherein the terminal device is determined to experience leakage when at least one of the following conditions is met:
   the voltage variation indicates that voltage of the battery continues to drop within a preset time period;
   the voltage variation within the preset time period exceeds a preset threshold; or
   the current consumption is stable and lasts longer than the preset time period.

4. The method of claim 1, wherein the at least one power-consuming component is in the non-working state when the terminal device is in a low-power state.

5. The method of claim 4, wherein the low-power state comprises a screen-off standby state and a power-off state.

6. The method of claim 1, further comprising:
   controlling the terminal device to display information indicative of power consumption of the battery, and controlling the terminal device to send out leakage prompt information upon determining that the terminal device experiences leakage.

7. A terminal device, comprising:
   a battery;
   at least one power-consuming component, powered by the battery when the terminal device is fully charged by an adapter and remains coupled with the adapter;
   a detecting circuit, configured to detect power consumption of the battery when the at least one power-consuming component is in a non-working state; and
   a processor, coupled with the detecting circuit and configured to determine whether the terminal device experiences leakage according to the power consumption detected.

8. The terminal device of claim 7, wherein the detecting circuit comprises at least one of a voltage detecting circuit and a current detecting circuit.

9. The terminal device of claim 8, wherein the voltage detecting circuit comprises:
   a first resistor, having one end coupled with one end of the battery; and
   a second resistor, having one end coupled with the other end of the first resistor at a first node and another end grounded, the first node being served as an output of the voltage detecting circuit.

10. The terminal device of claim 8, wherein the current detecting circuit comprises:
    a first resistor, having one end coupled with one end the battery, and the other end coupled with the other end of the battery via the at least one power-consuming component;
    a second resistor, having one end coupled with the one end of the first resistor;
    a third resistor, having one end coupled with the other end of the first resistor;
    an amplifier, having an negative input end coupled with another end of the second resistor, a positive input end coupled with another end of the third resistor; and a fourth resistor, coupled between the negative input end and an output end of the amplifier, the output end of the amplifier being served as an output end of the current detecting circuit.

11. The terminal device of claim 8, wherein the power consumption refers to at least one of voltage variation of the battery and current consumption of the battery.

12. The terminal device of claim 11, wherein the terminal device is determined to experience leakage when at least one of the following conditions is met:

the voltage variation indicates that voltage of the battery continues to drop within a preset time period;

the voltage variation within the preset time period exceeds a preset threshold; or the current consumption is stable and lasts longer than the preset time period.

13. The terminal device of claim 7, wherein the at least one power-consuming component is in the non-working state when the terminal device is in a low-power state.

\* \* \* \* \*